(12) United States Patent
Vick et al.

(10) Patent No.: US 9,257,335 B2
(45) Date of Patent: Feb. 9, 2016

(54) ELECTRONIC DEVICES UTILIZING CONTACT PADS WITH PROTRUSIONS AND METHODS FOR FABRICATION

(71) Applicant: Research Triangle Institute, Research Triangle Park, NC (US)

(72) Inventors: Erik Vick, Raleigh, NC (US); Garry Brian Cunningham, Fuquay-Varina, NC (US); Dorota Temple, Cary, NC (US)

(73) Assignee: Research Triangle Institute, Research Triangle Park, NC (US)

( * ) Notice: Subject to any disclaimer, the term of this patent is extended or adjusted under 35 U.S.C. 154(b) by 0 days.

(21) Appl. No.: 14/426,302

(22) PCT Filed: Sep. 4, 2013

(86) PCT No.: PCT/US2013/058046
§ 371 (c)(1),
(2) Date: Mar. 5, 2015

(87) PCT Pub. No.: WO2014/039546
PCT Pub. Date: Mar. 13, 2014

(65) Prior Publication Data
US 2015/0235898 A1      Aug. 20, 2015

Related U.S. Application Data

(60) Provisional application No. 61/697,120, filed on Sep. 5, 2012.

(51) Int. Cl.
*H01L 21/768* (2006.01)
*H01L 23/48* (2006.01)
*H01L 23/00* (2006.01)

(52) U.S. Cl.
CPC ........ *H01L 21/76898* (2013.01); *H01L 23/481* (2013.01); *H01L 24/03* (2013.01); *H01L 24/05* (2013.01); *H01L 2224/0311* (2013.01); *H01L 2224/05025* (2013.01)

(58) Field of Classification Search
CPC . H01L 21/76898; H01L 23/481; H01L 24/05; H01L 24/03; H01L 2224/0311; H01L 2224/05025; H01L 21/768; H01L 23/00; H01L 23/48
USPC ........................... 257/774, 773; 438/109, 667
See application file for complete search history.

(56) References Cited

U.S. PATENT DOCUMENTS

2004/0197979 A1   10/2004   Jeong et al.
2005/0064707 A1*  3/2005    Sinha ................ H01L 21/76898
                                                 438/667

(Continued)

FOREIGN PATENT DOCUMENTS

KR    10-2010-0124894 A    10/2010

OTHER PUBLICATIONS

International Search Report for International Application No. PCT/US2013/058046 mailed on Dec. 27, 2013.

*Primary Examiner* — Alexander Oscar Williams
(74) *Attorney, Agent, or Firm* — Olive Law Group, PLLC; David P. Gloekler

(57) ABSTRACT

An electronic device includes a substrate including a front side, a back side, a thickness between the front side and back side, one or more front-side vias extending from the front side into a part of the thickness, and an interconnect via extending from the back side toward the front side; a contact pad on the front side and including one or more protrusions extending through corresponding front-side vias and into the interconnect via; and an interconnect extending through the interconnect via and into contact with the protrusion(s).

30 Claims, 6 Drawing Sheets

(56) References Cited

U.S. PATENT DOCUMENTS

| | | | |
|---|---|---|---|
| 2007/0161235 A1* | 7/2007 | Trezza | H01L 21/6835 438/667 |
| 2008/0303152 A1 | 12/2008 | Zhang | |
| 2009/0218687 A1 | 9/2009 | Chou et al. | |
| 2009/0267183 A1* | 10/2009 | Temple | H01L 21/76898 257/532 |
| 2009/0305502 A1* | 12/2009 | Lee | H01L 21/76898 438/667 |
| 2010/0105169 A1 | 4/2010 | Lee et al. | |
| 2013/0154107 A1* | 6/2013 | Kim | H01L 21/76898 257/774 |
| 2013/0200528 A1* | 8/2013 | Lin | H01L 21/6836 257/774 |
| 2014/0084473 A1* | 3/2014 | Moon | H01L 21/76898 257/751 |
| 2014/0346680 A1* | 11/2014 | Gers | H01L 21/76898 257/774 |

* cited by examiner

ELECTRONIC DEVICES UTILIZING CONTACT PADS WITH PROTRUSIONS AND METHODS FOR FABRICATION

RELATED APPLICATIONS

This application is the national stage of International Application No. PCT/US2013/058046, filed Sep. 4, 2013, titled "LOCATION OF SENSORS IN WELL FORMATIONS," which claims the benefit of U.S. Provisional Patent Application Ser. No. 61/697,120, filed on Sep. 5, 2012, titled "ELECTRONIC DEVICES UTILIZING CONTACT PADS WITH PROTRUSIONS AND METHODS FOR FABRICATION," the contents of both of which are incorporated by reference herein in their entireties.

TECHNICAL FIELD

The present invention relates generally to electronics fabrication in which three-dimensional (3D) or vertical interconnects are utilized for signal communication, and more specifically to forming low-resistance contacts between such interconnects and protrusions provided by contact pads.

BACKGROUND

Conventional microelectronic devices are packaged in a planar or two-dimensional (2D) surface-mount configuration. In this configuration, the package size (particularly the footprint) is dictated by both the number of and physical dimensions of the integrated circuit (IC) chips or other discrete devices included in the package, as well as the area occupied by the discrete surface-mounted passive components utilized. There is a continuing demand for smaller electronic products that at the same time provide a higher level of functionality. Hence, there is a concomitant demand for higher-performance, smaller-footprint packaged microelectronic devices for use in such products. In response, researchers continue to develop three-dimensional (3D) integration or chip-stacking technologies as an alternative to the conventional 2D format. By implementing 3D integration, multiple die may be "vertically" arranged (in the third dimension) in a single packaged electronic device, with adjacent die communicating by way of 3D (or "vertical") metal interconnects extending through the thicknesses of the die substrates. 3D integration may be done at the wafer level (wafer-to-wafer bonding), the die level (die-to-die bonding), or in a hybrid format (die-to-wafer bonding). 3D packages can provide various advantages, such as shorter signal propagation delay (and thus faster signal processing), lower power consumption, reduced cross-talk, smaller package footprint, smaller device size, and higher input/output (I/O) count and density. Moreover, the different die stacked in the 3D package may be configured to provide different functions. For example, one die might include an active electronic device while another die might include an arrangement of passive components (resistors, capacitors, inductors, etc.), an array of memory modules, or a ground plane that communicates with several interconnects.

The formation of 3D metal interconnects has generally been accomplished by either a "vias first" approach or a "vias last" approach. In the "vias first" approach, the interconnects are formed prior to circuitry fabrication, substrate thinning, and substrate (die or wafer) bonding. In the "vias last" approach, the interconnects are formed after circuitry fabrication, substrate thinning, and substrate bonding. Particularly in the case of the "vias last" approach, the interconnect metal may need to be deposited through more than one layer of material in order for the metal to land on the surface of a contact pad and form a low-resistance electrical coupling with the contact pad. For example, to reach the contact pad the interconnect metal may need to be deposited through a deep via that extends through the entire thickness of one substrate and possibly partially into the thickness of an adjacent substrate where the contact pad is located, as well as through one or more intervening layers between these two substrates such as bonding layers, insulating layers, passivation layers, etc. Moreover, as a result of preceding material addition steps, an etching step (i.e., "bottom-clear" etching) such as deep reactive ion etching (DRIE) is typically required to expose the contact pad prior to the interconnect metallization step. Effective etching and interconnect metallization steps become more challenging as the aspect ratio (i.e., depth-to-diameter) of the vias increases.

There continues to be a need for improved methods for fabricating electronic devices that provide high-quality, low-resistance contact between interconnects and contact pads.

SUMMARY

To address the foregoing problems, in whole or in part, and/or other problems that may have been observed by persons skilled in the art, the present disclosure provides methods, processes, systems, apparatus, instruments, and/or devices, as described by way of example in implementations set forth below.

According to one embodiment, a method for fabricating an electronic device includes: forming a front-side via in a substrate, the substrate comprising a front side, a back side and a thickness between the front side and the back side, wherein the front-side via extends from the front side into a part of the thickness; forming a contact pad comprising a protrusion, by depositing a contact pad material on the front side such that the contact pad material fills the front-side via; forming an interconnect via by etching the substrate from the back side until exposing the protrusion in the interconnect via; and forming an interconnect in contact with the contact pad by depositing an interconnect material which coats the back side surrounding the interconnect via, extends through a cross-section of the interconnect via, and contacts the frontside protrusion.

According to another embodiment, a method for fabricating an electronic package includes: fabricating a first electronic device according any of the methods disclosed herein; and integrating the first electronic device with a second electronic device such that the interconnect of the first electronic device is in signal communication with a current-carrying element of the second electronic device.

According to another embodiment, an electronic device is provided, which is fabricated according to any of the methods disclosed herein.

According to another embodiment, an electronic package is provided, which is fabricated according to any of the methods disclosed herein.

According to another embodiment, an electronic device includes: a substrate comprising a front side, a back side, a thickness between the front side and the back side, a front-side via extending from the front side into a part of the thickness, and an interconnect via extending from the back side toward the front side; a contact pad comprising a base layer disposed on the front side and a protrusion extending from the base layer, through the front-side via and into the interconnect via; and an interconnect extending through the interconnect via and into contact with the protrusion, wherein the interconnect is disposed on a portion of the back side surrounding the interconnect via, on a wall of the substrate circumscribing a cross-section of the interconnect via, and on the protrusion.

According to another embodiment, an electronic package includes: a first electronic device according to any of the embodiments disclosed herein; and a second electronic device integrated with the first electronic device such that the interconnect is in signal communication with a current-carrying element of the second electronic device.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1A:
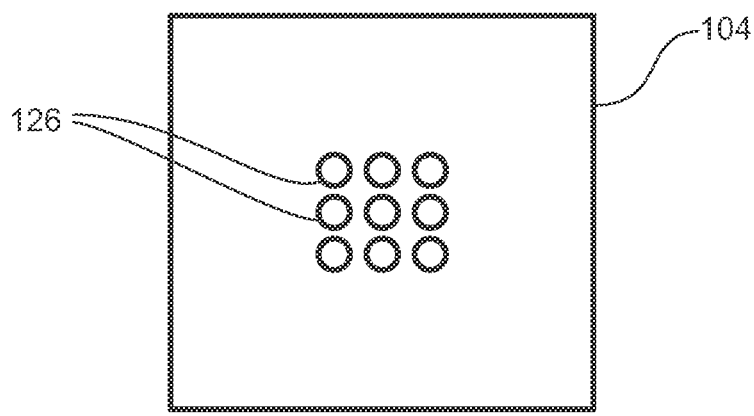
FIGS. 1A and 1B are schematic top and cross-sectional side views, respectively, illustrating an example of a method for fabricating an electronic device according to an embodiment of the present disclosure, in which a pattern of vias is formed into the front side of a substrate which may include frontside dielectric or passivation layers.

FIGS. 1-4 illustrate an example of a method for fabricating an electronic device according to an embodiment of the present disclosure. Referring to FIGS. 1A (top view) and 1B (cross-sectional side view), a substrate 104 is provided. The substrate 104 may be a wafer from which multiple die are singulated. Alternatively, the substrate 104 may be a die singulated from a wafer. Singulation or dicing may occur before or after forming electrically conductive interconnects, which are described below. As a single die, the substrate 104 may include one or more interconnects as described below. The substrate 104 generally includes a front side 106, an opposing back side 108, and a substrate thickness (or bulk thickness) between the front side 106 and back side 108 (in the vertical direction, from the perspective of FIG. 1B). In the present context, the terms "front" and "back" are used merely in a relative sense and not as any limitation on the orientation of the substrate 104. In some embodiments, the substrate 104 includes a semiconductor material such as, for example, silicon, silicon-germanium alloy, silicon carbide, a Group III-V compound (e.g., gallium arsenide, gallium nitride, etc.), a Group II-VI compound (e.g., zinc oxide), etc. In other embodiments, the substrate 104 may include an electrically insulating or dielectric material such as, for example, a glass, a non-conductive oxide, a non-conductive nitride, a ceramic, etc. In other embodiments, the substrate 104 may include an electrically conductive material.

As used herein, the term "electronic device" generally encompasses any structure that includes a planar substrate and one or more electrical current-carrying features distinct from the substrate. The substrate is planar in that the surface area of its front side or back side (and typically both the front side and back side) is visually large relative to its thickness. As a typical yet non-limiting example, the substrate thickness may range from 100 µm to 750 µm, and the surface area may range from 1 cm$^2$ to 300 mm in diameter (706.5 cm$^2$). As noted above, the bulk composition comprising the substrate may or may not itself be capable of carrying current. In the present embodiment, the "one or more electrical current-carrying features" includes at least one through-substrate interconnect as described below. As used herein, the term "through-substrate" means that the interconnect extends through at least greater than half of the substrate thickness, but not necessarily through the entire substrate thickness. Depending on the embodiment, the electronic device may include other current-carrying features in addition to the interconnect(s). Other current-carrying features may include, for example, passive electronic components such as contact pads (or bond pads, landing pads, etc.), conductive traces or busses, resistors, capacitors, etc., active electronic components such as transistors, as well as one or more integrated circuits containing an ordered arrangement of several electronic components. The electronic device may additionally or alternatively include one or more microfabricated mechanical, electromechanical, optical, or radio frequency (RF) transmitting components. Such components or circuitry may be formed on or into the thickness of the substrate, and may be considered as being part of a device layer that is disposed on a surface of a base layer constituting the bulk substrate material. Thus, depending on the embodiment, the electronic device that includes the illustrated substrate 104 may also be considered as being a microelectronic device, an optoelectronic device, a micro-electromechanical systems (MEMS) device, etc.

Figure 1B:
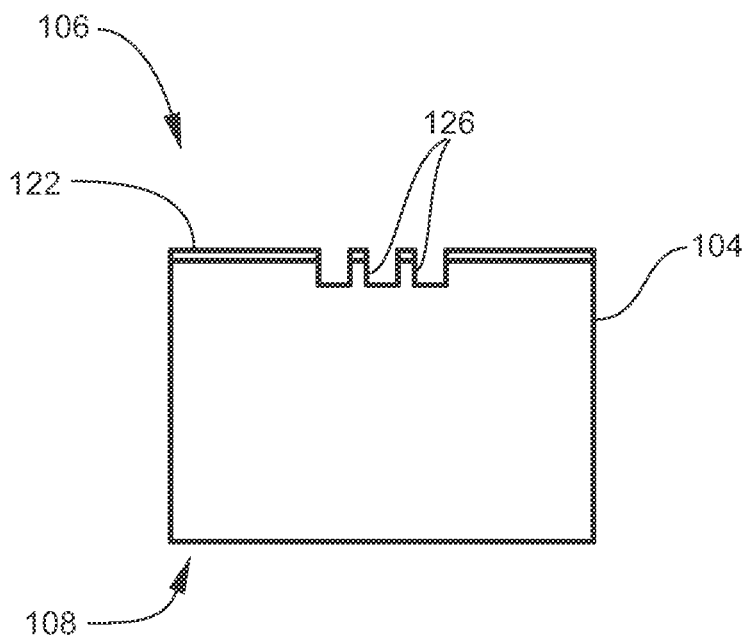

Continuing with FIGS. 1A and 1B, in some embodiments a first insulating layer 122 is formed on the substrate 104 at the front side 106. The first insulating layer 122 may be composed of any electrically insulating or dielectric material that is patternable, i.e., may be patterned by a suitable patterning technique such as photolithography. Examples of compositions of the first insulating layer 122 include, but are not limited to, photoresist, metal oxide (e.g., sapphire), metalloid oxide (e.g., silicon dioxide), metal nitride, metalloid nitride (e.g., silicon nitride), glass, quartz, diamond-like carbon (DLC), or parylene. The first insulating layer 122 if a photoresist may be an epoxy-based photoresist such as, for example, SU-8. In addition to photoresists, the first insulating layer 122 may be another type of polymer such as, for example, a polyimide (including co-polymers and blends thereof), a polyparaxylylene (i.e., from the family of Parylenes), a liquid crystal polymer (LCP), benzocyclobutene (BCB), or epoxy. Generally, the material of the first insulating layer 122 may or may not be photo-definable. If not itself photo-definable, the first insulating layer 122 may be patternable in the sense that openings may be formed through its thickness by way of a standard photolithography technique (e.g., patterning and exposure with the use of a photomask or reticle, followed by wet and/or dry etching) or an appropriate micromachining technique such as mechanical drilling, laser drilling, ultrasonic milling, etc.

The first insulating layer 122 may be formed to any desired thickness on the substrate 104. In some embodiments, the thickness of the first insulating layer 122 (measured from the surface of the substrate 104) ranges from 500 Å (0.05 µm) to 120,000 Å (12 µm). The first insulating layer 122 may be formed by any technique appropriate for its composition such as, for example, spin-coating, spray-coating, dip-coating, flow-coating, vacuum deposition (e.g., physical vapor deposition or chemical vapor deposition), evaporation, or lamination. Prior to forming the first insulating layer 122, the surface of the substrate 104 may be prepared as needed (e.g., cleaning/etching, dehydration by baking, etc.) After deposition to a desired thickness, the first insulating layer 122 is patterned, and the first insulating layer 122 and substrate 104 are etched from the front side 106, to form a pattern or group of front-side vias 126 in the substrate 104 such that the vias 126 extend through the first insulating layer 122 and into a part of the substrate thickness. The first insulating layer 122 may be patterned by any technique appropriate for its composition, a few examples of which are noted above. The frontside insulating layer 122 may also be a stack of insulating layers formed as a consequence of frontside processing such as multi-level metallization. Consequently, the frontside insulating layer 122 may be composed of dissimilar insulating materials, potentially with metal layers interposed. The pattern or group of front-side vias 126 may include only one front-side via or, as in the illustrated embodiment, may include more than one front-side via. In the illustrated embodiment, the pattern is a two-dimensional (e.g., 3×3) array of front-side vias 126. It will be understood, however, that the pattern may be a one-dimensional (linear) array of front-side vias 126, and that generally no limitation is placed on the number of front-side vias 126 formed, or the configuration or shape of the vias 126.

The front-side vias 126 may have a generally circular cross-section as illustrated in FIG. 1A, or alternatively may have another type of rounded cross-section, or a polygonal or irregularly shaped cross-section. In some embodiments, each front-side via 126 has a characteristic dimension ranging from 0.25 µm to 400 µm. In other embodiments, the characteristic dimension ranges from 0.5 µm to 100 µm. In the present context, the term "characteristic dimension" refers to a type of dimension that is appropriately descriptive for the shape of the cross-section of the via—for example, diameter in the case of a circular cross-section, major axis in the case of an elliptical cross-section, or a maximum width or height between two opposing sides in the case of a polygonal cross-section. The "characteristic dimension" of an irregularly shaped cross-section may be taken to be the dimension characteristic of a regularly shaped cross-section that the irregularly shaped cross-section most closely approximates (e.g., diameter of a circle, major axis of an ellipse, width or height of a polygon, etc.). In some embodiments, each front-side via 126 has a depth (in the direction of the substrate thickness) ranging from 50 Å (0.005 µm) to 7,500,000 Å (750 µm). In other embodiments, the depth ranges from 1 µm to 10 µm. In some embodiments, each front-side via 126 is spaced from at least one adjacent front-side via 126 (e.g., in a row or column) by a distance ranging from 0.25 µm to 400 µm. In other embodiments, the spacing ranges from 0.5 µm to 100 µm.

Figure 2A:
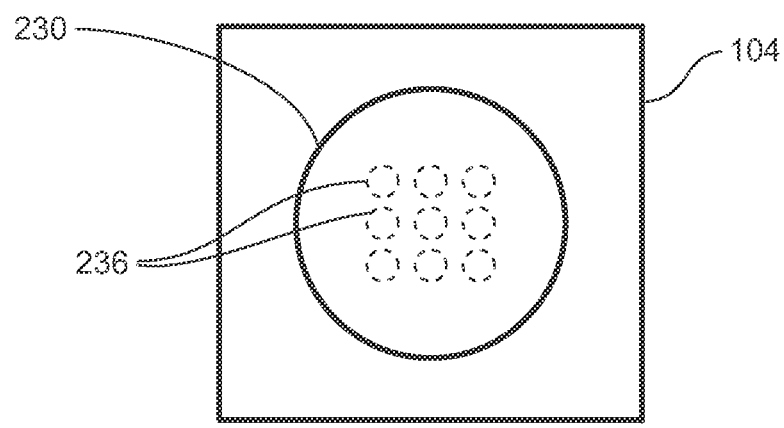
FIGS. 2A and 2B are schematic top and cross-sectional side views, respectively, illustrating the method, in which a contact pad with a pattern of protrusions is formed on the substrate by depositing and patterning a metal layer.
Figure 2B:
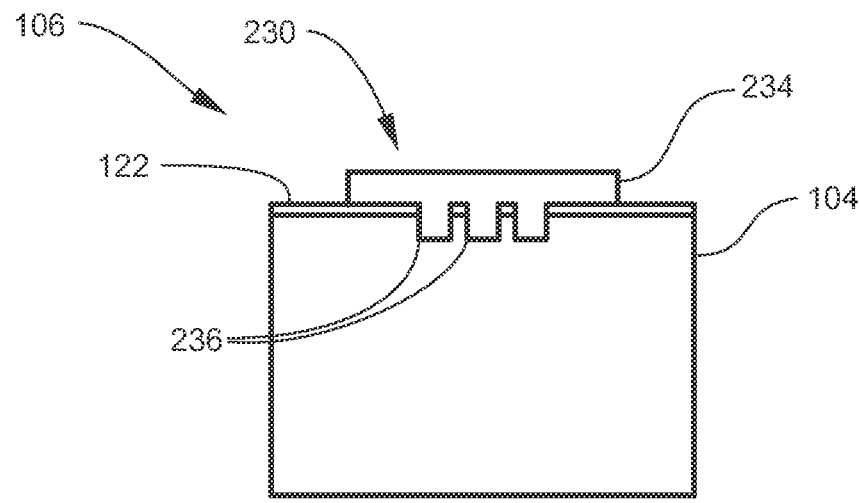

Referring to FIGS. 2A (top view) and 2B (cross-sectional side view), after forming the front-side vias 126 a metallization layer (not shown) is formed on the front side 106 of the substrate 104 by any suitable technique (e.g., vacuum deposition, electroplating, etc.). The metallization layer is then patterned (as shown) by any suitable technique (e.g., photolithography) to form one or more electrically conductive contact pads 230 on the substrate 104. The metallization material is deposited to a desired thickness on the front side 106, and is deposited conformally so as to fill in the previously formed front-side vias 126. As a result, each contact pad 230 may be considered as including a base layer 234 disposed on the front side 106, and a plurality of protrusions or plugs 236 (corresponding to a like number of filled-in front-side vias 126) extending into the substrate thickness toward the back side 108. The thickness of the base layer 234 (measured from the first insulating layer 122 or, if no first insulating layer 122 is provided, from the surface of the substrate 104) may, for example, range from 0.25 µm to 200 µm. The dimensions of the protrusions 236 may be comparable to those of the front-side vias 126 in which they are formed. Accordingly, in some embodiments each protrusion 236 has a characteristic dimension ranging from 0.25 µm to 400 µm. In other embodiments, the characteristic dimension ranges from 0.5 µm to 100 µm. In some embodiments each protrusion 236 has a thickness or depth, i.e., the distance over which the protrusion 236 extends from the base layer 234 into the substrate thickness, ranging from 50 Å (0.005 µm) to 7,500,000 Å (750 µm). In other embodiments, the depth ranges from 1 µm to 10 µm. In some embodiments each protrusion 236 is spaced from at least one adjacent protrusion 236 by a distance ranging from 0.25 µm to 400 µm. In other embodiments, the spacing ranges from 0.5 µm to 100 µm. The contact pad 230 may be composed of any suitable electrically conductive material such as, for example, copper, tungsten, tungsten silicide, nickel silicide, aluminum, aluminum alloy, titanium, titanium nitride, titanium-tungsten alloy, nickel, gold, silver, ruthenium, or any combination of two or more of the foregoing, or an alloy of one or more of the foregoing. For simplicity, FIGS. 2A and 2B illustrate a single contact pad 230 formed on a single pattern (or group) of front-side vias 126. It will be understood, however, that the substrate 104 may include more than one pattern of front-side vias 126, and a contact pad 230 may be formed on each pattern.

Figure 3A:
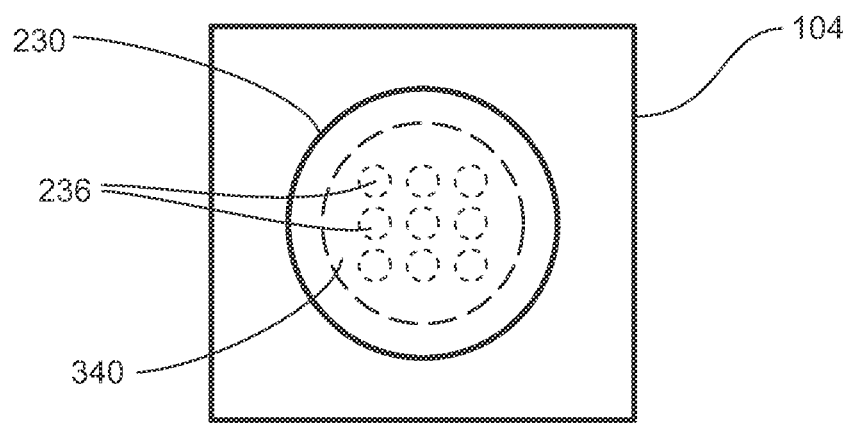
FIGS. 3A and 3B are schematic top and cross-sectional side views, respectively, illustrating the method, in which a via is formed into the back side of the substrate whereby the frontside protrusions are exposed in the via.
Figure 3B:
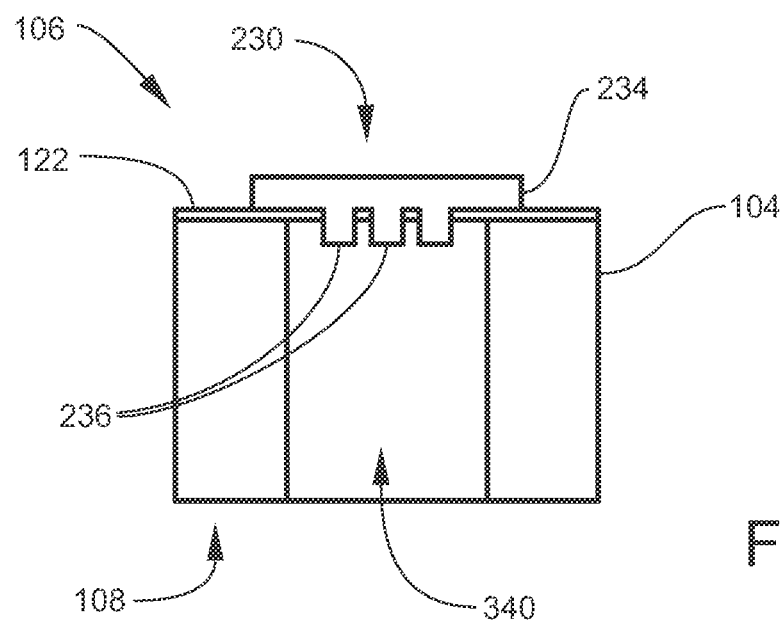

Referring to FIGS. 3A (top view) and 3B (cross-sectional side view), an interconnect via (or through-substrate via) 340 is formed in the substrate 104 from the back side 108 by any suitable means such as patterning and etching the substrate 104. The interconnect via 340 is formed in alignment with the contact pad 230. Starting at the back side 108, substrate material is removed until the interconnect via 340 exposes the protrusions 236 of the contact pad 230, whereby at least part of each protrusion 236 extends into the interconnect via 340. For this purpose, the first insulating layer 122 may serve as an etch-stop layer during the etching process. The interconnect via 340 may have a characteristic dimension greater than that of the protrusions 236, and the characteristic dimension may be large enough to expose all protrusions 236 associated with the corresponding contact pad 230. In some implementations, the characteristic dimension of the interconnect via 340 ranges from 1 µm to 400 µm. As noted above, the substrate 104 may include more than one contact pad 230 featuring protrusions 236, and thus may further include more than one interconnect via 340 in alignment with the corresponding contact pad 230.

Figure 4A:
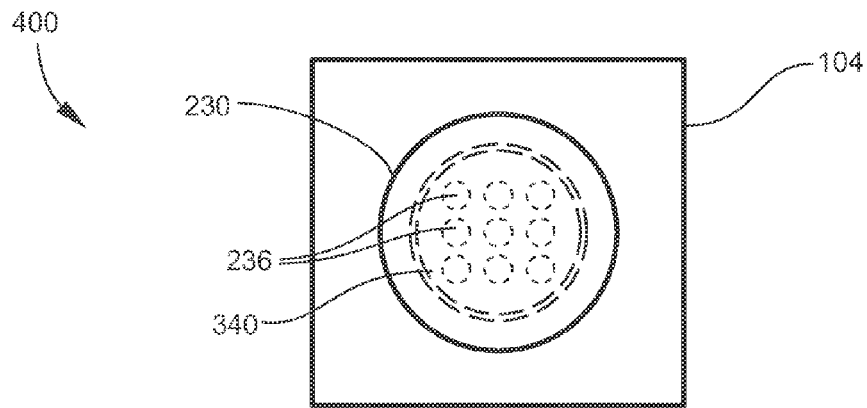
FIGS. 4A and 4B are schematic top and cross-sectional side views, respectively, illustrating the method, in which an interconnect is formed in the via in contact with the protrusions of the contact pad.

Referring to FIGS. 4A (top view) and 4B (cross-sectional side view), a second insulating layer 444 is conformally deposited on the back side 108 and in the interconnect via 340 such that it covers the back side 108, an inside wall of the substrate 104 circumscribing the interconnect via 340, and exposed portions of the first insulating layer 122 and the protrusions 236. The second insulating 444 layer may be composed of any electrically insulating or dielectric material, such as the examples given above in conjunction with the first insulating layer 122. The composition of the second insulating layer 444 may be the same as the composition of the first insulating layer 122, or may be different. After forming the second insulating layer 444, all or part of the portion of each protrusion 236 extending into the interconnect via 340 is re-exposed by selectively removing the second insulating layer 444 from the protrusions 236. Selective removal may be done, for example, by a suitable bottom-clearing technique such as anisotropic deep reactive ion etching (DRIE).

Figure 4B:
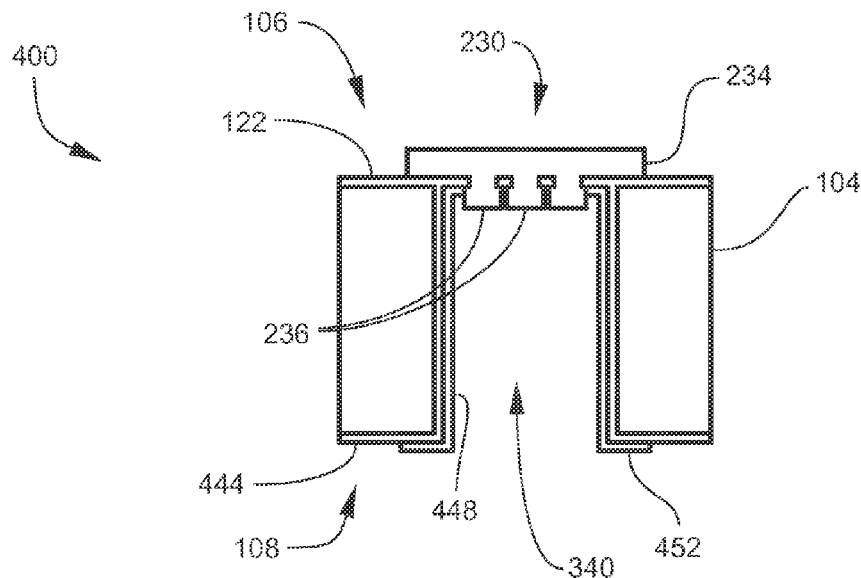

After re-exposing the protrusions 236, an interconnect 448 is formed in the interconnect via 340 by depositing an interconnect material in the interconnect via 340 such that the interconnect material at least conformally covers the second insulating layer 444 on the substrate inside wall and the exposed portions of the protrusions 236. Consequently, a low-resistance contact between the interconnect 448 and the contact pad 230 is formed by way of the interface between the interconnect 448 and the exposed protrusions 236 in the interconnect via 340. The protrusions 236 may facilitate the formation of a high-quality, low-resistance contact, by facilitating the bottom-clear process and/or by presenting an increased surface area available for making contact between the interconnect 448 and the contact pad 230. The interconnect material may, for example, be copper, aluminum, aluminum alloy, tungsten, titanium, titanium nitride, titanium-tungsten alloy, nickel, gold, silver, ruthenium, any combination of two or more of the foregoing, or an alloy of one or more of the foregoing. The interconnect material may be deposited by any technique suitable for its composition such as, for example, physical vapor deposition (PVD), chemical vapor deposition (CVD), metalorganic CVD (MOCVD), atomic layer deposition (ALD), electroplating, or evaporation. In other embodiments, the interconnect material may fill the interconnect via 340 along the entire or partial depth of the interconnect via 340. In some embodiments, deposition of the interconnect material forms a metallization layer over all or part of the substrate surface on the back side 108. As illustrated in FIG. 4B, the interconnect material on the back side 108 may be patterned as needed to form a second contact pad 452 or any other current-carrying feature.

As appreciated by persons skilled in the art, other finishing steps may be implemented as needed to complete the fabrication of an electronic device 400 having a desired structural and functional configuration. The electronic device 400 may be packaged with one or more other electronic devices as desired. Depending on the type of electronic package fabricated, the first contact pad(s) 230 and/or the second contact pad(s) 452 of the electronic device 400 may be placed in signal communication with a ball grid array (BGA), or with the contact pads, interconnects or other passive or active features of another electronic device.

By way of example, the implementation of the method described above entails the formation of insulating layers 122 and 444. The insulating layers 122 and 444 are useful when the interconnect 448 and contact pads 230 and 452 need to be electrically isolated from the substrate 104, such as when the substrate 104 is a semiconductor. For certain interconnect materials such as copper, the insulating layers 122 and 444 may also serve as barrier films preventing diffusion of the interconnect material into the substrate 104. In other implementations, however, the substrate 104 may be composed of a non-conductive material that does not need to be isolated from the interconnect 448 and contact pads 230 and 452 and is not adversely affected by diffusion of the interconnect material. In these other implementations, one or both of the insulating layers 122 and 444 may be eliminated. For example, in FIG. 2B the metallization may be deposited directly on the surface of the substrate 104. In this example, referring to FIG. 3B the etching process may be controlled to stop after exposing the protrusions 236 but before reaching the contact pad 230, in which case the layer 122 in FIG. 3B may represent substrate material that is not removed by etching. Alternatively, in forming the interconnect via 340 of FIG. 3B the substrate material may be etched down to the underside of the contact pad 230. As another example, in FIG. 4B the interconnect 340 may be formed directly on the back surface and inside wall of the substrate 104.

Figure 5:
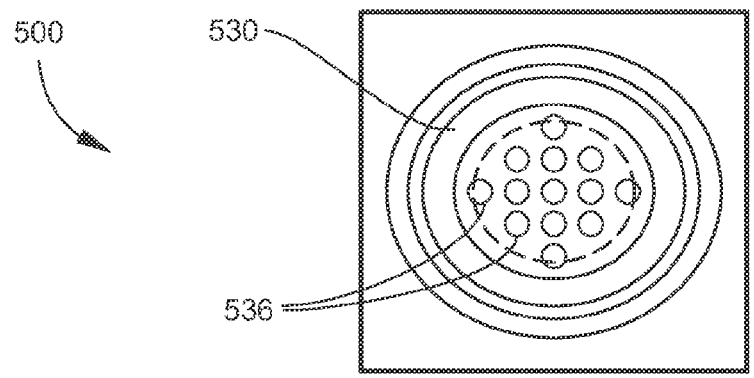
FIG. 5 is a top view of an example of an electronic device according to another embodiment.
Figure 6:
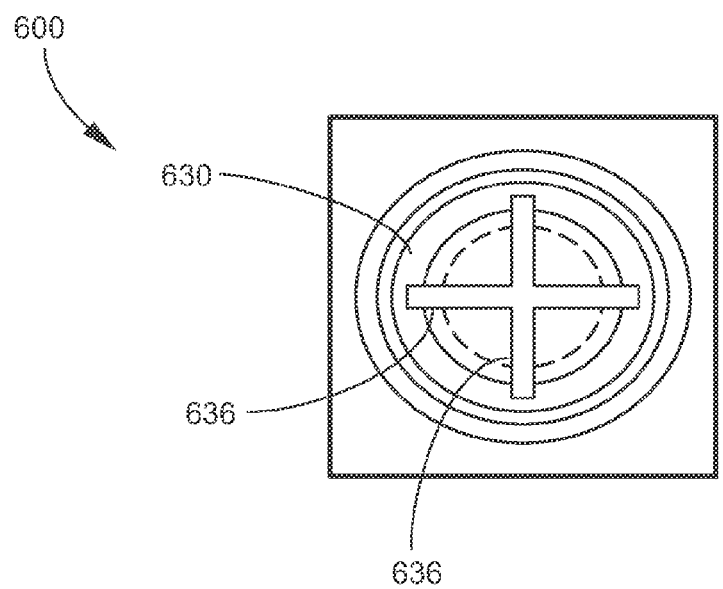
FIG. 6 is a top view of an example of an electronic device according to another embodiment utilizing different protrusion configurations.

As noted above, each contact pad 230 formed on the front side 106 of the substrate 104 may include a single protrusion 236 or a pattern or group of two or more protrusions 236. The pattern may be a one-dimensional or two-dimensional array, or may be any other type of pattern suitable for making a low-resistance contact with the corresponding interconnect. FIG. 5 is a top view of an example of an electronic device 500 according to another embodiment. In FIG. 5, a contact pad 530 of the electronic device 500 includes a pattern of protrusions 536 arranged in a two-dimensional array in which different rows or columns may include different numbers of protrusions 536. FIG. 6 is a top view of an example of an electronic device 600 according to another embodiment. In FIG. 6, a contact pad 630 of the electronic device 600 includes at least one protrusion 636 that has a polygonal (e.g., rectilinear) cross-section in the plane transverse to the substrate thickness. In the illustrated example, one of the dimensions (e.g., length or width) of the polygonal cross-section is elongated relative to the other dimension, e.g., the cross-section is shaped as a rectangle or bar. Further in the illustrated example, the contact pad 630 includes a pattern of polygonal protrusions 636 that intersect such that the pattern is cross-shaped. From the foregoing descriptions, it will be appreciated that many other patterns and configurations of protrusions may be realized in accordance with the presently disclosed subject matter.

Figure 7:
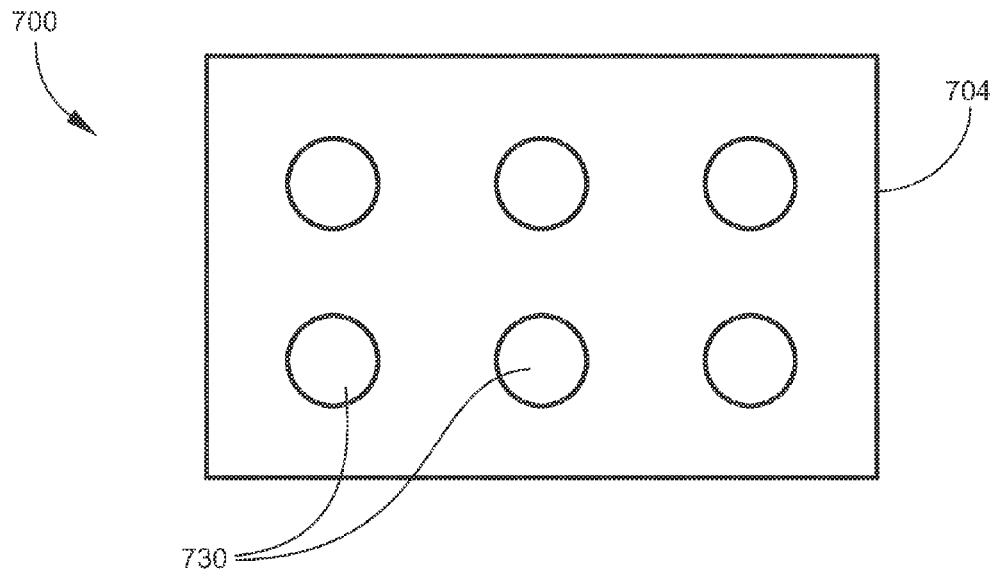
FIG. 7 is a top view of an example of an electronic device according to another embodiment.
Figure 8:
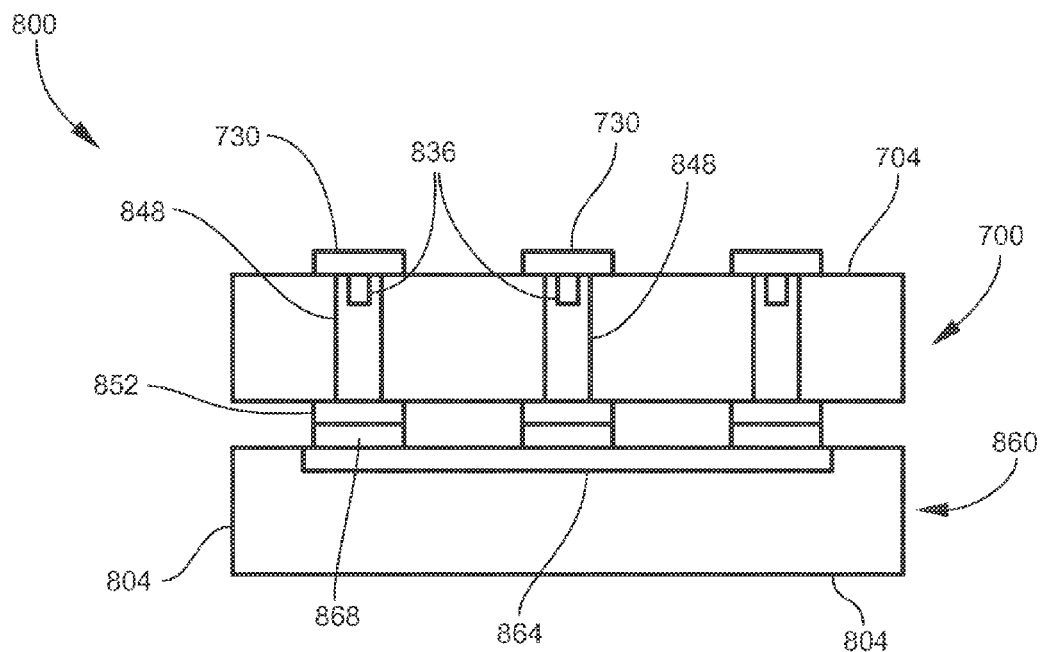
FIG. 8 is a cross-sectional side view of an example of an electronic package that includes the electronic device illustrated in FIG. 7.

FIG. 7 is a top view of an example of an electronic device 700 (or a section of the electronic device 700) according to another embodiment. The electronic device 700 is also shown in the cross-sectional side view of FIG. 8. The electronic device 700 includes a substrate 704 that may be a wafer intended to be sawed into individual die, or may be a die already singulated from a larger wafer, or may be a microchip or other microfabricated structure. The electronic device 700 includes a plurality of through-substrate interconnects 848 (FIG. 8) and corresponding first contact pads 730 and second contact pads 852 (FIG. 8). One or more of these contact pad/interconnect assemblies may be fabricated and configured as described above in conjunction with FIGS. 1-6. Accordingly, one or more of these contact pad/interconnect assemblies may include a pattern of (i.e., one or more) protrusions 836 (FIG. 8) as described above. In the present context, the "contact pads" may be representative of any type of current-carrying feature desired to be located on a surface of the substrate 704.

FIG. 8 is a cross-sectional side view of an example of an electronic package 800 that includes the electronic device 700 illustrated in FIG. 7. The electronic device 700 may be packaged with one or more other electronic devices 860 according to various techniques known to persons skilled in the art. In the illustrated example, a second electronic device 860 includes an active device 864 such as an integrated circuit (IC) or field programmable array (FGA) fabricated on a semiconductor substrate 804, and current-carrying features 868 in signal communication with the active device 864. The second electronic device 860 is packaged with the first electronic device 700 such that the current-carrying features 868 are in signal communication with respective contact pads 852 of the first electronic device 700.

For purposes of the present disclosure, it will be understood that when a layer (or film, region, substrate, component, device, or the like) is referred to as being "on" or "over" another layer, that layer may be directly or actually on (or over) the other layer or, alternatively, intervening layers (e.g., buffer layers, transition layers, interlayers, sacrificial layers, etch-stop layers, masks, electrodes, interconnects, contacts, or the like) may also be present. A layer that is "directly on" another layer means that no intervening layer is present, unless otherwise indicated. It will also be understood that when a layer is referred to as being "on" (or "over") another layer, that layer may cover the entire surface of the other layer or only a portion of the other layer. It will be further understood that terms such as "formed on" or "disposed on" are not intended to introduce any limitations relating to particular methods of material transport, deposition, fabrication, surface treatment, or physical, chemical, or ionic bonding or interaction. The term "interposed" is interpreted in a similar manner.

In general, terms such as "communicate" and "in . . . communication with" (for example, a first component "communicates with" or "is in communication with" a second component) are used herein to indicate a structural, functional, mechanical, electrical, signal, optical, magnetic, electromagnetic, ionic or fluidic relationship between two or more components or elements. As such, the fact that one component is said to communicate with a second component is not intended to exclude the possibility that additional components may be present between, and/or operatively associated or engaged with, the first and second components.

It will be understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for fabricating an electronic device, the method comprising:
    forming a front-side via in a substrate, the substrate comprising a front side, a back side and a thickness between the front side and the back side, wherein the front-side via extends from the front side into a part of the thickness;
    forming a contact pad comprising a protrusion, by depositing a contact pad material on the front side such that the contact pad material fills the front-side via;
    forming an interconnect via by etching the substrate from the back side until exposing the protrusion in the interconnect via; and
    forming an interconnect in contact with the contact pad by depositing an interconnect material in the interconnect via such that the interconnect material is at least conformally disposed on a portion of the back side surrounding the interconnect via, on a wall of the substrate circumscribing a cross-section of the interconnect via, and on the protrusion.

2. The method of claim 1, wherein forming the contact pad comprises forming a base layer from which the protrusion extends to a distance ranging from 0.005 µm to 750 µm.

3. The method of claim 1, wherein the protrusion has a characteristic dimension ranging from 0.25 µm to 400 µm.

4. The method of claim 1, wherein the protrusion has a rectilinear cross-section in a plane transverse to the thickness, and the protrusion is elongated in one dimension of the cross-section.

5. The method of claim 1, wherein forming the front-side via comprises forming a pattern of front-side vias, the contact pad comprises a pattern of protrusions, forming the interconnect via comprises exposing the protrusions in the interconnect via, and forming the interconnect comprises depositing the interconnect material on the protrusions.

6. The method of claim 5, wherein forming the contact pad comprises forming a two-dimensional array of protrusions.

7. The method of claim 5, wherein each protrusion is spaced from at least one adjacent protrusion by a distance ranging from 0.25 µm to 400 µm.

8. The method of claim 5, wherein forming the pattern comprises forming at least a first protrusion and a second protrusion each having a rectilinear cross-section in a plane transverse to the thickness, and the first protrusion and the second protrusion are elongated in mutually orthogonal directions.

9. The method of claim 1, wherein forming the interconnect comprises filling the interconnect via with the interconnect material through substantially the entire thickness.

10. The method of claim 1, comprising forming a current-carrying element in contact with the interconnect by patterning the interconnect material disposed on the back side.

11. The method of claim 1, comprising forming an insulating layer on the front side, wherein the front-side via is formed through the insulating layer and the protrusion extends through the insulating layer.

12. The method of claim 11, wherein forming the interconnect via comprises etching the substrate down to the insulating layer, and forming the interconnect comprises depositing the interconnect material on the insulating layer.

13. The method of claim 11, wherein the insulating layer on the front side is a first insulating layer, and further comprising conformally depositing a second insulating layer on the back side, the wall and the protrusion, and re-exposing at least a portion of the protrusion by selectively etching the second insulating layer, and wherein forming the interconnect comprises conformally depositing the interconnect material on the second insulating layer and on the re-exposed portion of the protrusion.

14. The method of claim 1, comprising forming a plurality of interconnects, wherein each interconnect is in contact with a respective contact pad.

15. A method for fabricating an electronic package, comprising:
    fabricating a first electronic device according to claim 1; and
    integrating the first electronic device with a second electronic device such that the interconnect is in signal communication with a current-carrying element of the second electronic device.

16. An electronic device fabricated according to the method of claim 1.

17. An electronic device, comprising:
- a substrate comprising a front side, a back side, a thickness between the front side and the back side, a front-side via extending from the front side into a part of the thickness, and an interconnect via extending from the back side toward the front side;
- a contact pad comprising a base layer disposed on the front side and a protrusion extending from the base layer, through the front-side via and into the interconnect via; and
- an interconnect extending through the interconnect via and into contact with the protrusion, wherein the interconnect is disposed on a portion of the back side surrounding the interconnect via, on a wall of the substrate circumscribing a cross-section of the interconnect via, and on the protrusion.

18. The electronic device of claim 17, wherein the interconnect via is larger in cross-sectional area than the front-side via by a factor ranging from 0 to 100%.

19. The electronic device of claim 17, wherein the protrusion extends from the base layer to a distance ranging from 0.005 µm to 750 µm.

20. The electronic device of claim 17, wherein the protrusion has a characteristic dimension ranging from 0.25 µm to 400 µm.

21. The electronic device of claim 17, wherein the protrusion has a rectilinear cross-section in a plane transverse to the thickness, and the protrusion is elongated in one dimension of the cross-section.

22. The electronic device of claim 17, wherein the front-side via comprises a pattern of front-side vias, the contact pad comprises a pattern of protrusions extending through respective front-side vias into the interconnect via, and the interconnect contacts each protrusion.

23. The electronic device of claim 22, wherein the contact pad comprises a two-dimensional array of protrusions.

24. The electronic device of claim 22, wherein each protrusion is spaced from at least one adjacent protrusion by a distance ranging from 0.25 µm to 400 µm.

25. The electronic device of claim 22, wherein the pattern comprises at least a first protrusion and a second protrusion each having a rectilinear cross-section in a plane transverse to the thickness, and the first protrusion and the second protrusion are elongated in mutually orthogonal directions.

26. The electronic device of claim 17, wherein the interconnect fills the interconnect via through substantially the entire thickness.

27. The electronic device of claim 17, comprising an insulating layer on the front side, wherein the front-side via is formed through the insulating layer and the protrusion extends through the insulating layer.

28. The electronic device of claim 27, wherein the insulating layer on the front side is a first insulating layer, and further comprising a second insulating layer disposed on the back side and the wall wherein the second insulating layer isolates the substrate from the interconnect.

29. The electronic device of claim 17, comprising forming a plurality of interconnects, wherein each interconnect is in contact with a respective contact pad.

30. An electronic package, comprising: a first electronic device according to claim 17; and a second electronic device integrated with the first electronic device such that the interconnect is in signal communication with a current-carrying element of the second electronic device.

* * * * *